United States Patent
Chan et al.

(10) Patent No.: US 11,417,557 B2
(45) Date of Patent: Aug. 16, 2022

(54) SPIRALING POLYPHASE ELECTRODES FOR ELECTROSTATIC CHUCK

(71) Applicant: ENTEGRIS, INC., Billerica, MA (US)

(72) Inventors: Chun Wang Chan, Cambridge, MA (US); Jakub Rybczynski, Arlington, MA (US); Yan Liu, Lexington, MA (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 17/122,959

(22) Filed: Dec. 15, 2020

(65) Prior Publication Data
US 2022/0189811 A1 Jun. 16, 2022

(51) Int. Cl.
*H01T 23/00* (2006.01)
*H01L 21/683* (2006.01)

(52) U.S. Cl.
CPC ................................ *H01L 21/6833* (2013.01)

(58) Field of Classification Search
None
See application file for complete search history.

(56) References Cited

U.S. PATENT DOCUMENTS

| | | | |
|---|---|---|---|
| 5,822,172 A | 10/1998 | White | |
| 7,126,091 B1 * | 10/2006 | Westfall | ............. H01L 21/6831 219/444.1 |
| 8,149,562 B2 | 4/2012 | Hsu | |
| 8,226,769 B2 | 7/2012 | Matyushkin | |
| 8,325,457 B2 | 12/2012 | Park | |
| 8,358,493 B2 | 1/2013 | Kugimoto | |
| 2002/0006680 A1 * | 1/2002 | Katala | ................ H01L 21/6831 438/22 |
| 2009/0284894 A1 * | 11/2009 | Cooke | ................ H01L 21/6875 361/234 |
| 2015/0228523 A1 | 8/2015 | Lee | |
| 2016/0336210 A1 * | 11/2016 | Cooke | ................ H01L 21/6833 |

FOREIGN PATENT DOCUMENTS

| | | |
|---|---|---|
| JP | 11330218 A | 11/1999 |
| JP | 2003179128 A | 6/2003 |
| JP | 42477392 | 2/2005 |
| KR | 100652244 B1 | 12/2006 |
| KR | 20110064665 A | 6/2011 |
| KR | 101401473 B1 | 6/2014 |

* cited by examiner

*Primary Examiner* — Stephen W Jackson
(74) *Attorney, Agent, or Firm* — Entegris, Inc.

(57) ABSTRACT

Electrostatic chucks include multiple electrodes, each having a spiral shape surrounding a center of a surface of the electrostatic chuck, to provide a polyphase electrostatic chuck. Each electrode can be connected to a different phase of power. The spiral shapes can each avoid one another as well as avoiding holes or openings in the surface of the electrostatic chuck. The spiral shapes can be algorithmically determined using a processor. These electrostatic chucks can include three or more electrodes. Methods of manufacture of the electrostatic chucks include determining shapes for each of the electrodes and providing each of the electrodes.

20 Claims, 3 Drawing Sheets

SPIRALING POLYPHASE ELECTRODES FOR ELECTROSTATIC CHUCK

FIELD

This disclosure is directed to electrodes for use in an electrostatic chuck, particularly spiral patterns of multiple electrodes to provide a polyphase electrostatic chuck.

BACKGROUND

Electrostatic chucks can be used for retaining wafers in semiconductor processing. Electrostatic chucks can use different phases of alternating current (AC) voltage to help manage the loss of force periodically occurring when AC voltage is used to operate the chuck. Two phases can be provided through discrete regions or through comb designs. More than two phases can be provided in discrete regions. The use of discrete regions for each phase can cause imbalance of wafers as the force applied by different regions varies over time with the alternating current used. This can be particularly notable when there is other support for the wafers such as pins to which the wafer is held by the force of the electrostatic chucks, as the wafer can tilt about the support based on the force applied by different regions of the electrostatic chuck.

SUMMARY

This disclosure is directed to electrodes for use in an electrostatic chuck, particularly spiral patterns of multiple electrodes to provide a polyphase electrostatic chuck.

Interdigitated spiral patterns allow each of multiple electrodes to surround a center of an electrostatic chuck, instead of having to divide the chuck into discrete regions for each phase. This allows more consistent holding of secured wafers in the chuck, suppressing variance in position due to changes in power and certain phases dropping out due to the nature of alternating current. The suppression of variance in position also ensures that distances remain constant, allowing capacitance measurements to be accurately and consistently taken at any point on the electrostatic chuck, for example capacitance measurements used for determining whether a wafer is clamped or other control of the electrostatic chuck.

In an embodiment, an electrostatic chuck includes a plurality of electrodes formed on a surface in a spiral pattern. Each of the plurality of electrodes is interdigitated and each of the plurality of electrodes surrounds a center of the surface.

In an embodiment the surface is a ceramic surface. In an embodiment, the spiral pattern is configured to avoid one or more holes formed in the surface. In an embodiment, the surface is generally circular in shape.

In an embodiment, each of the plurality of electrodes is connected to a different circuit configured to provide power of a different phase. In an embodiment, each of the plurality of electrodes has a starting point at a perimeter of the surface. In an embodiment, the plurality of electrodes includes at least three electrodes. In an embodiment, the plurality of electrodes includes at least six electrodes.

In an embodiment, a method of clamping a wafer includes placing the wafer on the electrostatic chuck and providing power to each of the plurality of electrodes.

In an embodiment, a method of manufacturing an electrostatic chuck includes determining a pattern by which a plurality of electrodes can be provided on a surface, interdigitated with one another, such that each electrode extends from a starting point to an end point, each electrode surrounding a center of the surface, and providing the plurality of electrodes on the surface according to the pattern.

In an embodiment, determining the pattern includes using an algorithm to determine the pattern based on the dimensions of the surface and any openings provided on said surface.

In an embodiment, the surface is a ceramic surface. In an embodiment, the pattern is configured to avoid one or more openings formed in the surface.

In an embodiment, providing the plurality of electrodes on the surface includes defining each of the electrodes using photolithography. In an embodiment, providing the plurality of electrodes on the surface includes foil sintering. In an embodiment, providing the plurality of electrodes on the surface includes printing each electrode with a conductive ink.

In an embodiment, the method further includes connecting each of the plurality of electrodes to a different circuit, each of said circuits configured to provide power having a different phase from the other said circuits.

In an embodiment, the plurality of electrodes includes at least three electrodes. In an embodiment, the plurality of electrodes includes at least six electrodes.

DRAWINGS

DETAILED DESCRIPTION

This disclosure is directed to electrodes for use in an electrostatic chuck, particularly spiral patterns of multiple electrodes to provide a polyphase electrostatic chuck.

Figure 1:
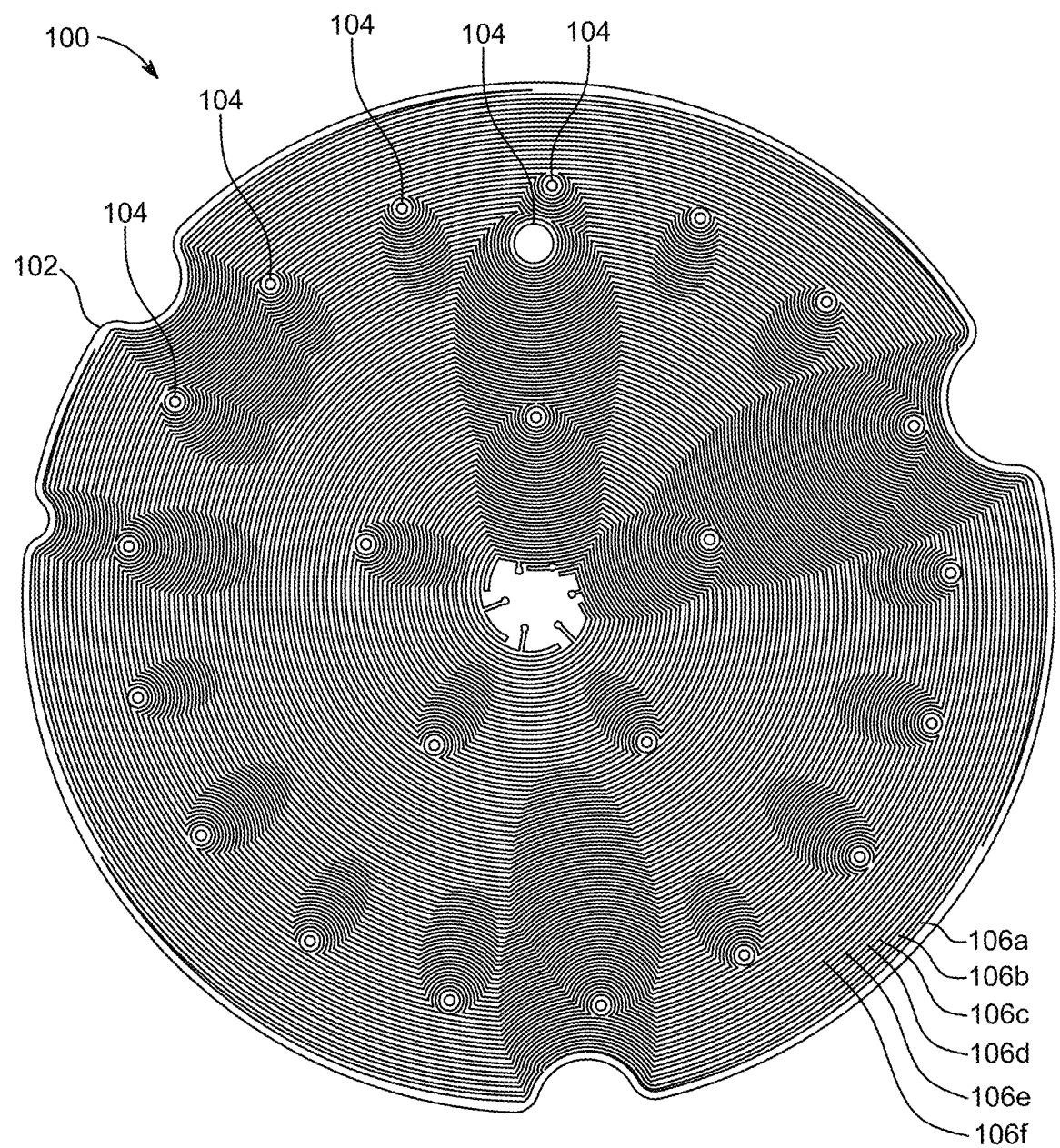
FIG. 1 shows a plan view of an electrostatic chuck according to an embodiment.

FIG. 1 shows a plan view of an electrostatic chuck according to an embodiment. In the plan view of electrostatic chuck 100 in FIG. 1, surface 102 can be seen, along with openings 104 and electrodes 106a-f.

Surface 102 is a surface of electrostatic chuck 100 configured to face and/or contact a wafer. Surface 102 can include any suitable material, such as, for example, dielectric materials. Non-limiting examples of suitable dielectric materials for use on or as surface 102 include polymer materials, glass materials, and/or ceramic materials. The dielectric material can be a bulk material or a thin film coating surface 102. Surface 102 can have any suitable shape for an electrostatic chuck, such as, for example, a generally circular, square, or rectangular shape in plan view. In an embodiment, the perimeter of the surface 102 can include recesses, projections, or any other features departing from the general overall shape of the electrostatic chuck such as the recesses shown around the generally circular shape of surface 102 as shown in FIG. 1.

Openings 104 are openings formed in the surface 102. The openings 104 can be, for example, flow paths for gas cooling, places to accommodate sensors such as capacitance sensors or other suitable sensors.

Electrodes 106a-f are a plurality of electrodes provided on surface 102, each having a spiral shape, with the spiral shapes positioned such that electrodes 106a-f interdigitated with one another. In an embodiment, there may be different numbers of electrodes from the six electrodes 106a-f shown in FIG. 1. In an embodiment, there are two or more electrodes 106. In another embodiment, there are three or more electrodes 106. The electrodes 106a-f can each have a spiral shape such that each electrode surrounds a center of surface 102. The electrodes 106a-f are arranged in a pattern such that each of the electrodes are interdigitated with one another. The electrodes 106a-f are arranged such that each of the electrodes 106a-f do not contact with or cross one another. In an embodiment, each of electrodes 106a-f have a spiral shape, with the respective spiral shapes of each electrode having its respective starting and ending points distributed around the surface 102. In an embodiment, the respective starting points for each of electrodes 106a-f can be evenly radially distributed around a center of surface 102, for example, being 120 degrees apart from one another when there are three electrodes 106, or 60 degrees apart from one another when there are six electrodes 106a-f as shown in FIG. 1. The pattern of the electrodes 106a-f can be algorithmically determined. In an embodiment, the pattern of the electrodes is configured to avoid openings 104 such that the electrodes 106a-f do not contact or cross the openings 104 while keeping each of the electrodes 106a-f continuous from their start point to their end point, and keeping each of electrodes 106a-f separate from one another.

Figure 2:
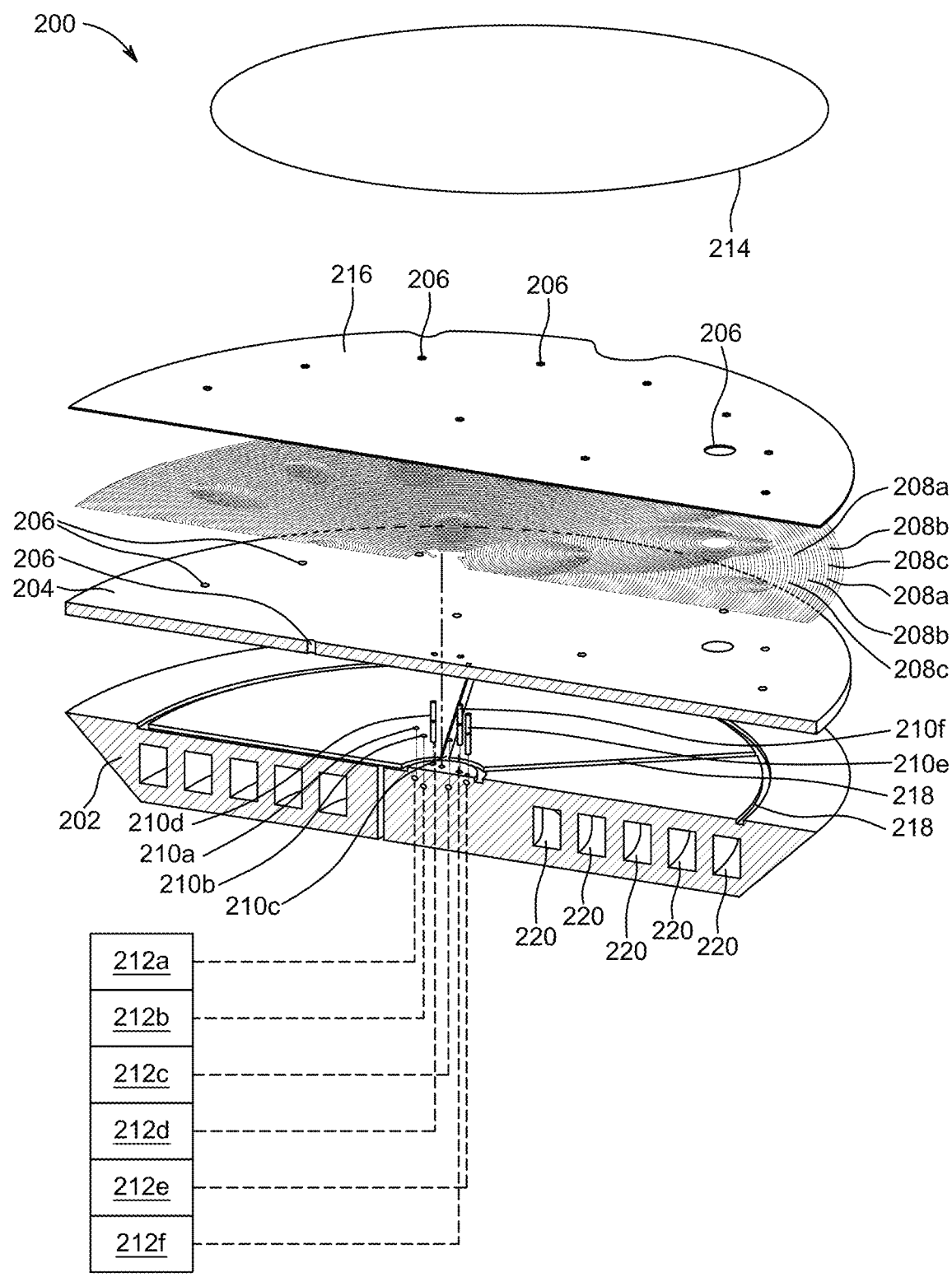
FIG. 2 shows a perspective view of an electrostatic chuck according to an embodiment.

FIG. 2 shows an exploded section view of an electrostatic chuck according to an embodiment. Electrostatic chuck 200 includes base 202 and surface 204. Optionally, one or more openings 206 can be provided on surface 204. A plurality of electrodes 208a-f are provided. Each electrode 208a-f may be connected by connection pins 210-f to a corresponding power source 212a-f. Electrostatic chuck 200 can be used to retain a wafer 214. In an embodiment, a second surface 216 can be provided between electrodes 208a-f and the wafer 212.

Electrostatic chuck 200 retains wafers such as wafer 214 by providing electrostatic force clamping the wafer to the electrostatic chuck 200. Electrostatic chuck 200 can be used with any suitable type of wafer such as semiconductor wafers or insulating wafers.

Base 202 can be a body of electrostatic chuck 200 supporting surface 204. In embodiments, the base 202 can optionally contain water and/or gas cooling systems for cooling the chuck 200 and any clamped wafer 214. Gas cooling systems can, for example, include channels 218 formed towards and within the surface of base 202. Water cooling systems can, for example, include flow paths 220 formed within base 200. In embodiments, the wiring 210a-f and/or the power sources 212a-f shown schematically in FIG. 2 can be located within the base 202.

Surface 204 is a surface of electrostatic chuck 200 configured to face and/or contact the wafer 214. Surface 204 can include any suitable material, such as, for example, dielectric materials. Non-limiting examples of suitable dielectric materials for use on or as surface 204 include polymer materials, glass materials, and/or ceramic materials. The dielectric material can be a bulk dielectric material making up some or all of surface 204, or a thin film covering surface 204.

Openings 206 are openings formed in the surface 204. The openings 206 can be used, for example, as flow paths for gas cooling, places to accommodate any suitable sensors or portions thereof such as ground pins of capacitance sensors, places to accommodate actuators such as lift pins, or any other suitable function in an electrostatic chuck. Some or all of openings 206 can have differing sizes. The sizes and positions of each of the openings 206 can be suitable for the purpose of that particular opening.

Electrodes 208a-f are each separate electrodes of the electrostatic chuck 200. Electrodes 208a-f can be provided, for example, on one or both of surface 204 and on a side of second surface 216 facing surface 204. In an embodiment, there may be different numbers of electrodes from the six electrodes 208a-f shown in FIG. 1. In an embodiment, there are two or more electrodes 208. In an embodiment, there are three or more electrodes 208. The electrodes 208a-f can each have a spiral shape such that each electrode surrounds a center of surface 204. The electrodes 208a-f are arranged in a pattern such that each of the electrodes are interdigitated with one another. The electrodes 208a-f are arranged such that each of the electrodes 208a-f do not contact with or cross one another. In an embodiment, each of electrodes 208a-f have a generally spiral shape, with the respective spiral shapes of each electrode having starting and ending points distributed around the surface 204. In an embodiment, the respective starting points for each of electrodes 208a-f can be evenly radially distributed around a center of surface 204, for example, being 120 degrees apart from one another when there are three electrodes 208, or 60 degrees apart from one another when there are six electrodes 208a-f as shown in FIG. 2. The pattern of the electrodes 208a-f can be algorithmically determined. In an embodiment, the pattern of the electrodes is configured to avoid openings 206 such that the electrodes 208a-f do not contact or cross the openings 206, while keeping each of the electrodes 208a-f continuous from their start point to their end point, and keeping each of electrodes 208a-f separate from one another. The electrodes 208a-f can avoid openings 206 by curving around the respective openings 206, and other electrodes 208a-f may include similar curves to avoid contacting other electrodes where they deviate to avoid those openings 206.

Connection pins 210a-f allow each of respective electrodes 208a-f to be connected to corresponding power sources 212a-f. Power sources 212a-f each provide power to the respective connected electrode from among electrodes 208a-f. In embodiments having different numbers of electrodes 208, there can be a connection pin 210 and a power source 212 for each of the electrodes of that embodiment. Each of power sources 212a-f can provide alternating current (AC) power or having a different phase to the respective electrode 208a-f or direct current (DC) power of differing polarity, such that losses in force due to fluctuations in power at each of the electrodes 208a-f are separated in time from one another. In an embodiment, each of power sources 212a-f provides AC power having a different phase. In an embodiment, one or more of power sources 212a-f provides DC power of each polarity. Accordingly, the clamping force can be maintained over time by using the power sources 212a-f to provide power having the particular phases or polarities to the respective electrodes 208a-f.

Wafer 214 is a wafer that can be retained by the electrostatic chuck 200. In an embodiment, wafer 214 is a semiconductor wafer. In an embodiment, wafer 214 is an insulating wafer. A non-limiting example of an insulating wafer is a glass wafer. Interdigitated electrode structures as described herein may be necessary to properly clamp glass wafers. Further, wafer 214 can be retained more uniformly using spiraling patterns of interdigitated electrodes described herein. In an embodiment, wafer 214 has a shape generally corresponding to the shape of surface 204, for example, with wafer 214 and surface 204 each being generally circular in shape. In embodiments, the wafer 214 and surface 204 can each have generally rectangular shapes, generally square shapes, or the like. When the electrodes 208a-f are receiving power, wafer 214 can be clamped to the electrostatic chuck 200 by force provided by the powered electrodes 208a-f. In an embodiment, when wafer 214 is clamped to the electrostatic chuck 200, wafer 214 contacts one or more projections (not shown) provided on or near electrostatic chuck 200. In an embodiment, the projections contacting wafer 214 include two or more pins extending from surface 204. In an embodiment, the presence of wafer 214 can be detected by a capacitance sensor, such as one included in one or more of the openings 206, or by at least some of the electrodes 208a-f themselves functioning as the capacitance sensors.

In embodiments, second surface 216 can be provided over the electrodes 208a-f. Second surface 216 can further cover portions of surface 204 left exposed by the electrodes 208a-f. The second surface 216 can be, for example, one or more dielectric materials. Non-limiting examples of suitable dielectric materials for use on or as surface 204 include polymer materials, glass materials, and/or ceramic materials. The dielectric material can be a bulk dielectric material making up some or all of surface 204, or a thin film covering surface 204.

In an embodiment, clamping wafer 214 to electrostatic chuck 200 can be performed by activating the power sources 212a-f to each provide power to their respective electrode 208a-f. Each of the electrodes 208a-f can thus provide electrostatic force when powered by its respective power source 212a-f, thereby clamping wafer 214 to the electrostatic chuck 200. The different phases of power can be selected such that the electrodes 208a-f continuously provide clamping force, for example by ensuring that at least one of electrodes 208a-f is always receiving a non-zero amount of power by having at least some of power sources 212a-f being out of phase with one another. The wafer 214 can be de-clamped from the electrostatic chuck 200 by, for example, cutting off power from the power source 212a-f to the respective electrodes 208a-f. The clamping and dec-lamping can be performed on demand through control of the power sources 212a-f or their provision of power to the respective electrodes 208a-f.

Figure 3:
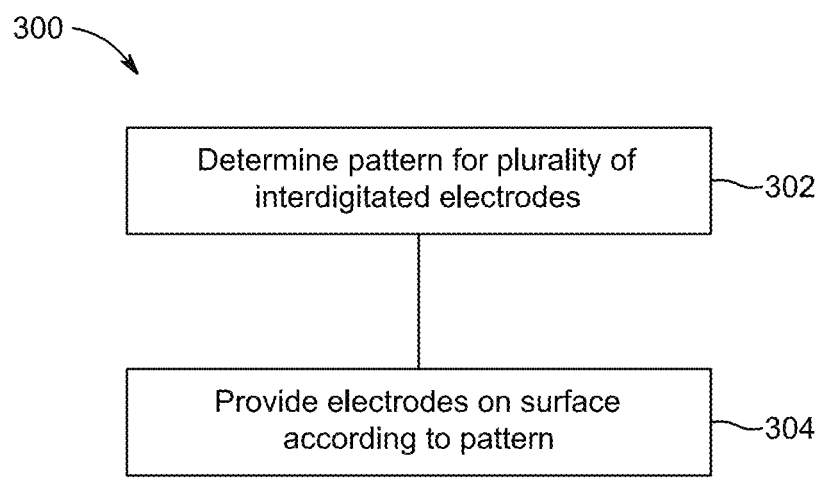
FIG. 3 shows a flowchart of a method for manufacturing an electrostatic chuck according to an embodiment.

FIG. 3 shows a flowchart of a method for manufacturing an electrostatic chuck according to an embodiment. Method 300 includes determining a pattern for providing a plurality of interdigitated electrodes 302 and providing the electrodes 304.

A pattern is determined for providing the plurality of interdigitated electrodes at 302. The pattern can be a pattern in which each of the plurality of electrodes extends from a starting point to an ending point, with each electrode surrounding a center of a surface. The pattern is a pattern such that none of the plurality of electrodes contact or cross one another. The pattern can be a spiral for each of the electrodes included in the plurality of electrodes. The pattern can be based on a shape of the surface of the electrostatic chuck, such as a circular, square, or rectangular shape. In embodiments, the pattern can include one or more of the electrodes being configured to avoid openings in the surface on which the plurality of electrodes is to be provided. The plurality of electrodes can include any suitable number of electrodes for a polyphase electrostatic chuck for retaining a wafer. In an embodiment, the plurality of electrodes includes at least three electrodes. In an embodiment, the plurality of electrodes includes an even number of electrodes. In an embodiment, the plurality of electrodes includes six electrodes.

In an embodiment, each electrode in the pattern determined at 302 can include a starting point at or near a perimeter of the surface of the electrostatic chuck and an ending point closer to a center of the surface of the electrostatic chuck when compared to the starting point. The respective starting points and/or ending points of each electrode in the pattern can be radially spaced apart from one another with respect to the center of the surface of the electrostatic chuck. In an embodiment, the starting points and/or ending points of each of the electrodes can be evenly radially distributed around the center of the surface of the electrostatic chuck, for example being offset from one another by 120 degrees when there are three electrodes, offset from one another by 90 degrees when there are four electrodes, offset from one another by 60 degrees when there are six electrodes, and the like.

In an embodiment, the pattern can be algorithmically determined at 302 using a processor, based on inputs such as the number of electrodes to be provided, the size and shape of the surface on which the electrodes are to be provided, any openings in the surface that are to be avoided by the electrodes, and the like.

The electrodes are provided on the surface at 304. The surface can be any suitable surface for an electrostatic chuck, such as a dielectric material. Non-limiting examples of the dielectric material include ceramics, glass, polymers, or the like. The surface can have any suitable shape for an electrostatic chuck, such as a circular, square, or rectangular shape. The electrodes are provided on the surface at 304 according to the pattern determined at 302. The electrodes can be provided on the surface by any suitable means for forming electrodes. Non-limiting examples of methods for providing the electrodes at 304 include photolithographic methods, foil sintering methods, or conductive ink printing. Photolithographic methods can include, as non-limiting examples, depositing a conductive layer on the surface and using photolithography to define the electrodes, a lift-off method where the conductive layer is deposited on a photoresist and removed with the photoresist. Foil sintering methods can include, for example, sandwiching shaped bulk conductive foil between ceramic surfaces to form the electrodes. The electrodes can further be formed such that they each have contacts configured to be connected to a power source such that each of the formed electrodes can be powered by the power source when the electrostatic chuck is in operation. Printing using conductive inks can include, for example, silk-screen printing using a metal ink to provide electrodes 304 in accordance with the pattern determined at 302.

Aspects:

It is understood that any of aspects 1-9 can be combined with any of aspects 10-18.

Aspect 1. An electrostatic chuck, comprising a plurality of electrodes formed on a surface in a spiral pattern, wherein each of the plurality of electrodes is interdigitated and each of the plurality of electrodes surrounds a center of the surface.

Aspect 2. The electrostatic chuck according to aspect 1, wherein the surface is a ceramic surface.

Aspect 3. The electrostatic chuck according to any of aspects 1-2, wherein the spiral pattern is configured to avoid one or more holes formed in the surface.

Aspect 4. The electrostatic chuck according to any of aspects 1-3, wherein the surface is generally circular in shape.

Aspect 5. The electrostatic chuck according to any of aspects 1-4, wherein each of the plurality of electrodes is connected to a different circuit configured to provide power of a different phase.

Aspect 6. The electrostatic chuck according to any of aspects 1-5, wherein each of the plurality of electrodes has a starting point at a perimeter of the surface.

Aspect 7. The electrostatic chuck according to any of aspects 1-6, wherein the plurality of electrodes includes at least three electrodes.

Aspect 8. The electrostatic chuck according to any of aspects 1-7, wherein the plurality of electrodes includes at least six electrodes.

Aspect 9. A method of clamping a wafer, comprising: placing the wafer on the electrostatic chuck according to any of aspects 1-8, and providing power to each of the plurality of electrodes.

Aspect 10. A method of manufacturing an electrostatic chuck, comprising:
determining a pattern by which a plurality of electrodes can be provided on a surface, interdigitated with one another, such that each electrode extends from a starting point to an end point, each electrode surrounding a center of the surface, and
providing the plurality of electrodes on the surface according to the pattern.

Aspect 11. The method according to aspect 10, wherein the determining the pattern comprises using an algorithm to determine the pattern based on the dimensions of the surface and any openings provided on said surface.

Aspect 12. The method according to any of aspects 10-11, wherein the surface is a ceramic surface.

Aspect 13. The method according to any of aspects 10-13, wherein the pattern is configured to avoid one or more openings formed in the surface.

Aspect 14. The method according to any of aspects 10-14, wherein providing the plurality of electrodes on the surface comprises defining each of the electrodes using photolithography.

Aspect 15. The method according to any of aspects 10-14, wherein providing the plurality of electrodes on the surface comprises foil sintering.

Aspect 16. The method according to any of aspects 10-14, wherein the providing the plurality of electrodes on the surface comprises printing each electrode with a conductive ink.

Aspect 17. The method according to any of aspects 10-16, further comprising connecting each of the plurality of electrodes to a different circuit, each of said circuits configured to provide power having a different phase from the other said circuits.

Aspect 18. The method according to any of aspects 10-17, wherein the plurality of electrodes includes at least three electrodes.

Aspect 19. The method according to any of aspects 10-18, wherein the plurality of electrodes includes at least six electrodes.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. An electrostatic chuck, comprising
a plurality of electrodes, including at least first and second electrodes, formed on a surface in a spiral pattern configured to avoid a hole formed in the surface, wherein the plurality of electrodes are interdigitated, each of the plurality of electrodes surrounds a center of the surface and the first electrode forms a curve around the hole to avoid the hole and the second electrode forms a curve around the hole to avoid contacting the first electrode.

2. The electrostatic chuck of claim 1, wherein the surface is a ceramic surface.

3. The electrostatic chuck of claim 1, wherein the surface is generally circular in shape.

4. The electrostatic chuck of claim 1, wherein each of the plurality of electrodes is connected to a different circuit configured to provide power of a different phase.

5. The electrostatic chuck of claim 1, wherein each of the plurality of electrodes has a starting point at a perimeter of the surface.

6. The electrostatic chuck of claim 1, wherein the plurality of electrodes includes at least three electrodes.

7. The electrostatic chuck of claim 1, wherein the plurality of electrodes includes at least six electrodes.

8. A method of clamping a wafer, comprising:
placing the wafer on the electrostatic chuck of claim 1, and
providing power to each of the plurality of electrodes.

9. A method of manufacturing an electrostatic chuck, comprising:
determining a pattern by which a plurality of electrodes, including at least first and second electrodes, can be provided on a surface formed with a hole, interdigitated with one another, such that each electrode extends from a starting point to an end point, each electrode surrounding a center of the surface, and wherein the first electrode forms a curve around the hole to avoid the hole and the second electrode forms a curve around the hole to avoid contacting the first electrode, and
providing the plurality of electrodes on the surface according to the pattern.

10. The method of claim 9, wherein the determining the pattern comprises using an algorithm to determine the pattern based on the dimensions of the surface and any openings provided on said surface.

11. The method of claim 9, wherein the surface is a ceramic surface.

12. The method of claim 9, wherein providing the plurality of electrodes on the surface comprises defining each of the electrodes using photolithography.

13. The method of claim 9, wherein providing the plurality of electrodes on the surface comprises foil sintering.

14. The method of claim 9, wherein the providing the plurality of electrodes on the surface comprises printing each electrode with a conductive ink.

15. The method of claim 9, further comprising connecting each of the plurality of electrodes to a different circuit, each of said circuits configured to provide power having a different phase from the other said circuits.

16. The method of claim 9, wherein the plurality of electrodes includes at least three electrodes.

17. The method of claim 9, wherein the plurality of electrodes includes at least six electrodes.

18. The electrostatic chuck of claim 1, wherein the curve of the first electrode around the hole is concentric to the curve of the second electrode around the hole.

19. The electrostatic chuck of claim 1, wherein, after forming the curve around the hole, the first electrode extends around a portion of the spiral pattern, back towards the hole and then forms a second curve around the hole.

20. The method of claim 9, wherein the curve of the first electrode is concentric to the curve of the second electrode, each electrode of the plurality of electrodes forms a respective curve around the hole, and wherein, after forming the curve around the hole, the first electrode extends around the spiral pattern, back towards the hole and then forms a second curve around the hole.

* * * * *